(12) United States Patent
Kitabayashi

(10) Patent No.: US 10,056,434 B2
(45) Date of Patent: *Aug. 21, 2018

(54) ORGANIC LIGHT EMITTING DISPLAY PANEL AND METHOD OF MANUFACTURING THE SAME

(71) Applicant: Samsung Display Co., Ltd., Yongin-si (KR)

(72) Inventor: Atsushi Kitabayashi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/440,955

(22) Filed: Feb. 23, 2017

(65) Prior Publication Data
US 2017/0162633 A1 Jun. 8, 2017

Related U.S. Application Data

(63) Continuation of application No. 14/957,750, filed on Dec. 3, 2015, now Pat. No. 9,601,709.

(30) Foreign Application Priority Data

Mar. 18, 2015 (KR) .................. 10-2015-0037672

(51) Int. Cl.
*H01L 27/32* (2006.01)
*H01L 51/00* (2006.01)
(Continued)

(52) U.S. Cl.
CPC ...... *H01L 27/3216* (2013.01); *H01L 27/3206* (2013.01); *H01L 27/3246* (2013.01);
(Continued)

(58) Field of Classification Search
None
See application file for complete search history.

(56) References Cited

U.S. PATENT DOCUMENTS 7,710,025 B2 5/2010 Yamada et al.
7,956,535 B2 6/2011 Yanagihara
(Continued)

FOREIGN PATENT DOCUMENTS

JP 4174989 11/2008
KR 1020090066220 6/2009
(Continued)

OTHER PUBLICATIONS

Notice of Allowance dated Nov. 4, 2016, issued in U.S. Appl. No. 14/957,750.

*Primary Examiner* — Michael Lebentritt
(74) *Attorney, Agent, or Firm* — H.C. Park & Associates, PLC

(57) ABSTRACT

An exemplary embodiment discloses an organic light emitting display panel including a base substrate comprising first pixels configured to emit a light having a first wavelength and second pixels configured to emit a light having a second wavelength and a pixel definition layer disposed on the base substrate. The pixel definition layer includes first and second openings. The first opening corresponds to light emitting areas of n (n is a natural number equal to or greater than 2) first pixels among the first pixels. The second opening corresponds to light emitting areas of m (m is a natural number equal to or greater than 1 and smaller than n) second pixels among the second pixels. An area of the light emitting area of each of the first pixels is smaller than an area of the light emitting area of each of the second pixels.

11 Claims, 15 Drawing Sheets

(51) Int. Cl.
*H01L 51/52* (2006.01)
*H01L 51/50* (2006.01)

(52) U.S. Cl.
CPC ...... *H01L 51/0003* (2013.01); *H01L 51/5265* (2013.01); *H01L 51/5012* (2013.01)

(56) References Cited

U.S. PATENT DOCUMENTS

| | | |
|---|---|---|
| 8,183,768 B2 | 5/2012 | Ko |
| 9,601,709 B2 * | 3/2017 | Kitabayashi ........ H01L 51/5036 |
| 2005/0122294 A1 | 6/2005 | Ben-David et al. |
| 2007/0045549 A1 | 3/2007 | Wang et al. |
| 2008/0284737 A1 | 11/2008 | Kim et al. |
| 2009/0073099 A1 | 3/2009 | Yeates et al. |
| 2009/0091238 A1 | 4/2009 | Cok et al. |
| 2010/0097295 A1 | 4/2010 | Kwak |
| 2010/0207851 A1 | 8/2010 | Cok et al. |
| 2010/0328196 A1 | 12/2010 | Cok |
| 2011/0043541 A1 | 2/2011 | Cok |
| 2012/0295508 A1 | 11/2012 | Sung et al. |
| 2014/0284560 A1 | 9/2014 | Shim et al. |
| 2014/0292622 A1 | 10/2014 | Lee |
| 2014/0375826 A1 | 12/2014 | Lee et al. |
| 2015/0236080 A1 | 8/2015 | Cho |
| 2016/0204171 A1 | 7/2016 | Lee et al. |

FOREIGN PATENT DOCUMENTS

| | | |
|---|---|---|
| KR | 101065314 | 9/2011 |
| KR | 1020140118010 | 10/2014 |
| KR | 101499234 | 3/2015 |
| WO | 2001039554 | 5/2001 |

\* cited by examiner

ORGANIC LIGHT EMITTING DISPLAY PANEL AND METHOD OF MANUFACTURING THE SAME

CROSS-REFERENCE TO RELATED APPLICATION

This application is a Continuation of U.S. patent application Ser. No. 14/957,750, filed on Dec. 3, 2015, and claims priority from and the benefit of Korean Patent Application No. 10-2015-0037672, filed on Mar. 18, 2015, each of which is hereby incorporated by reference for all purposes as if fully set forth herein.

BACKGROUND

Field

Exemplary embodiments relate to an organic light emitting display panel and a method of manufacturing the same. More particularly, exemplary embodiments relate to an organic light emitting display panel manufactured using a solution process and a method of manufacturing the organic light emitting display panel.

Discussion of the Background

Recently, an organic light emitting diode display has been spotlighted as a next generation display device since it has superior brightness and viewing angle, and does not need to include a separate light source when compared to a liquid crystal display. Therefore, the organic light emitting diode display may be made thin and light weight. In addition, the organic light emitting diode display has other beneficial properties, e.g., low power consumption, high brightness, fast response speed.

The organic light emitting diode display includes an organic light emitting device that includes an anode electrode, a light emitting layer, and a cathode electrode. Holes and electrons are injected into the light emitting layer through the anode electrode and the cathode electrode, and are recombined in the light emitting layer to generate excitons. The excitons emit energy, which is discharged when an excited state returns to a ground state, as light.

In general, anodes are disposed on a substrate and an organic insulating layer is disposed on the substrate to cover the anodes. The organic insulating layer is patterned to have openings formed therethrough, and thus a pixel definition layer is formed. The anodes are partially exposed through the openings of the pixel definition layer. Areas defined by the openings are defined as light emitting areas of pixels. Hole transport areas and light emitting layers are formed on the anodes in the light emitting areas of the pixels.

However, the process of manufacturing an organic light emitting display is complex. Further, it is difficult to control the thickness of particular components of the organic light emitting display to provide the proper resonance structure.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display panel including a pixel defining layer, which is capable of simplifying a manufacturing process using an inkjet printing method and precisely controlling a thickness of an organic light emitting device with resonance structure.

Additional aspects will be set forth in the detailed description which follows, and, in part, will be apparent from the disclosure, or may be learned by practice of the inventive concept.

An exemplary embodiment discloses an organic light emitting display panel including a base substrate having first pixels configured to emit a light having a first wavelength and second pixels configured to emit a light having a second wavelength and a pixel definition layer disposed on the base substrate. The pixel definition layer includes first and second openings. The first opening corresponds to light emitting areas of n (n is a natural number equal to or greater than 2) first pixels among the first pixels. The second opening corresponds to light emitting areas of m (m is a natural number equal to or greater than 1 and smaller than n) second pixels among the second pixels. An area of the light emitting area of each of the first pixels is smaller than an area of the light emitting area of each of the second pixels.

The base substrate further includes a plurality of third pixels emitting a light having a third wavelength. The pixel definition layer further includes a third opening formed therethrough.

The third opening corresponds to light emitting areas of k (k is a natural number equal to or greater than 1 and smaller than m) third pixels.

The area of the light emitting area of each of the second pixels is smaller than an area of the light emitting area of each of the third pixels.

The first wavelength is longer than the second wavelength and the second wavelength is longer than the third wavelength.

The light emitting area of each of the first pixels is defined by an area in which a first anode disposed on the base substrate is overlapped with a first light emitting layer disposed on the first anode. The light emitting area of each of the second pixels is defined by an area in which a second anode disposed on the base substrate is overlapped with a second light emitting layer disposed on the second anode. The light emitting area of each of the third pixels is defined by an area in which a third anode disposed on the base substrate is overlapped with a third light emitting layer disposed on the third anode.

The first opening exposes areas defined between n first anodes among the n first anodes and the base substrate. The second opening exposes areas defined between m second anodes among the m second anodes and the base substrate. The third opening exposes areas defined between k third anodes among the k third anodes and the base substrate.

The organic light emitting display panel further includes a cathode disposed on the first, second, and third light emitting layers.

A length measured from the first anode to the cathode along a thickness direction of the first light emitting layer is longer than a length measured from the second anode to the cathode along a thickness direction of the second light emitting layer. A length measured from the second anode to the cathode along a thickness direction of the third light emitting layer is longer than a length measured from the third anode to the cathode along the thickness direction.

According to the above, an efficiency of the manufacturing process for the organic light emitting display panel may be improved. In addition, the thickness of the organic light emitting diode may be precisely controlled.

Embodiments of the inventive concept provide a method of manufacturing the organic light emitting display panel includes forming an anode layer, forming a pixel definition layer, forming hole transport regions, forming light emitting layers, forming electron transport regions, and forming a cathode.

Form an anode layer on a base substrate. An anode layer includes a plurality of first anodes and a plurality of second anodes each having an area greater than an area of each of the first anodes.

An exemplary embodiment also discloses a method of manufacturing an organic light emitting display panel including disposing an anode layer including first anodes and second anodes, each second anode having an area greater than each of the first anodes on a base substrate. The method also includes disposing a pixel definition layer including a first opening exposing n (n is a natural number equal to or greater than 2) first anodes of the first anodes and a second opening exposing m (m is a natural number equal to or greater than 1 and smaller than n) second anodes of the second anodes, disposing a liquefied material to areas corresponding to the first and second openings to form hole transport regions on the n first anodes and the m second anodes, disposing a first liquefied organic material to an area corresponding to the first opening to form a first light emitting layer and a second liquefied organic material to an area corresponding to the second opening to form a second light emitting layer, disposing electron transport regions on the first and second light emitting layers, and disposing a cathode on the electron transport regions.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
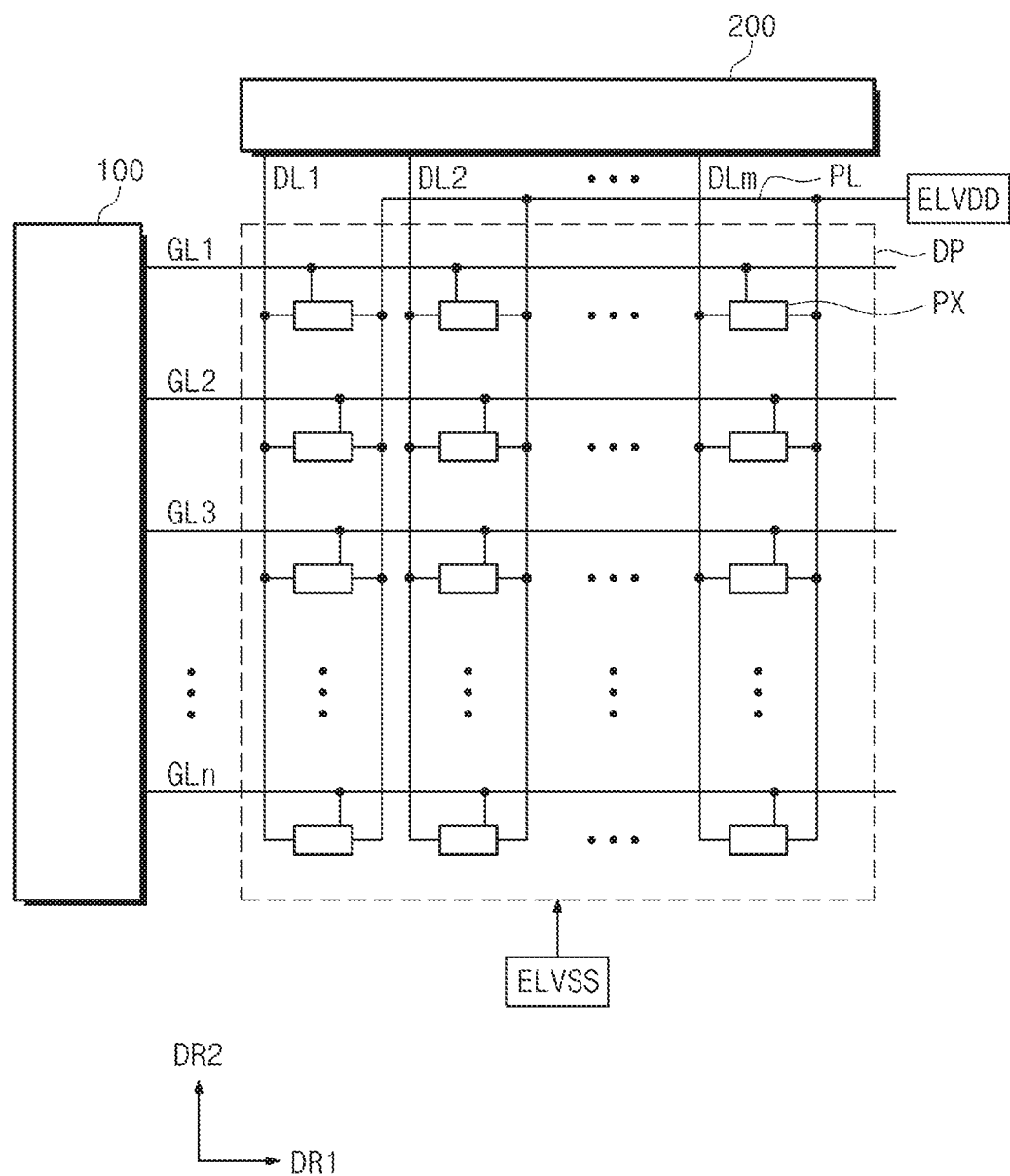
FIG. 1 is a block diagram illustrating an organic light emitting display device with an organic light emitting display panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a block diagram illustrating an organic light emitting display device having an organic light emitting display panel according to an exemplary embodiment.

Referring to FIG. 1, the organic light emitting display device includes a scan driver 100, a data driver 200, and an organic light emitting display panel DP.

The scan driver 100 receives a gate control signal (not shown) from a timing controller (not shown). The gate control signal includes a vertical start signal that starts an operation of the scan driver 100 and a clock signal that determines an output timing of signals. The scan driver 100 generates scan signals sequentially applied to gate lines GL1 to GLn. In addition, the scan driver 100 generates light emitting control signals in response to a gate control signal and applies the light emitting control signals to light emitting lines (not shown).

FIG. 1 illustrates a single scan driver 100 that outputs the scan signals to the gate lines GL1 to GLn. However, exemplary embodiments are not limited to a single scan driver 100. In other words, multiple scan drivers 100 may output the scan signals to the gate lines GL1 to GLn.

The data driver 200 receives a data control signal (not shown) and image data (not shown) from the timing controller. The data driver 200 converts the image data to data signals and applies the data signals to data lines DL1 to DLm insulated from the gate lines GL1 to GLn while crossing the gate lines GL1 to GLn. The data signals are analog voltages corresponding to grayscale values of the image data.

The organic light emitting display panel DP includes the gate lines GL1 to GLn, the data lines DL1 to DLm, and pixels PX. The gate lines GL1 to GLn extend in a first direction DR1 and are arranged in a second direction DR2 substantially perpendicular to the first direction DR1. The data lines DL1 to DLm are insulated from the gate lines GL1 to GLn while crossing the gate lines GL1 to GLn. In other words, a large portion of the data lines DL1 to DLm may extend in the second direction DR2 and arranged in the first direction DR1.

Each of the pixels PX is connected to a corresponding gate line of the gate lines GL1 to GLn and a corresponding data line of the data lines DL1 to DLm. Although not shown in FIG. 1, each of the pixels PX may be connected to multiple gate lines of the gate lines GL1 to GLn.

Figure 2:
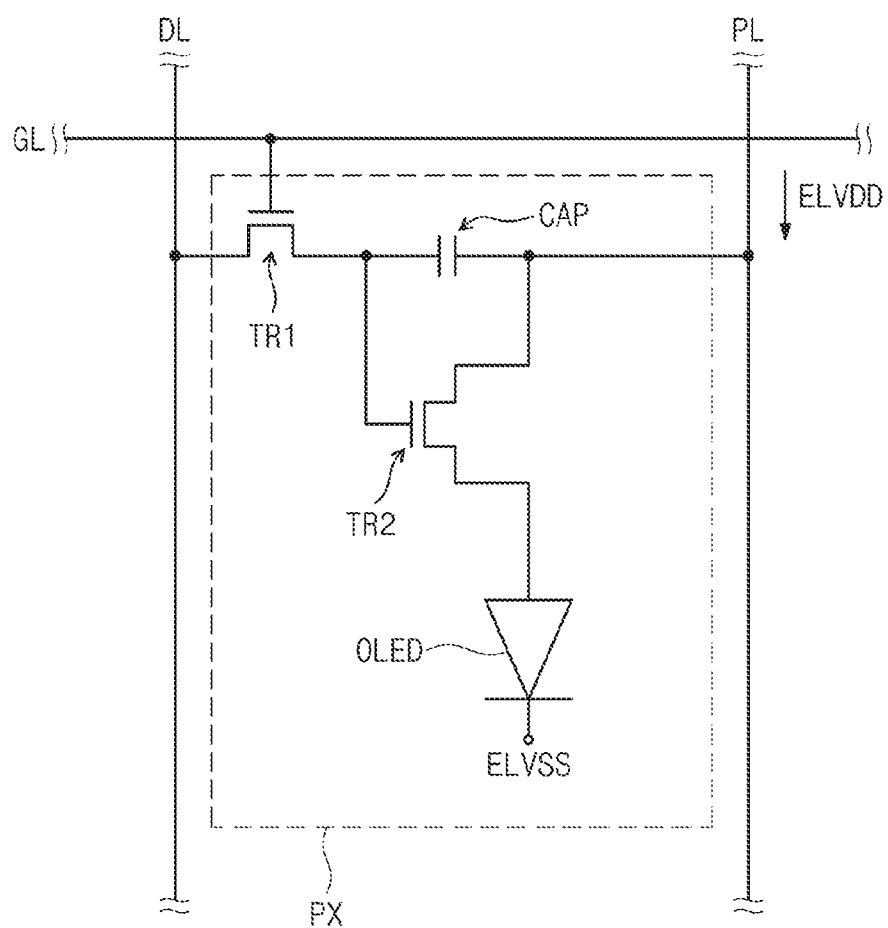
FIG. 2 is an equivalent circuit diagram illustrating a pixel of an organic light emitting display panel of FIG. 1.

FIG. 2 is an equivalent circuit diagram illustrating a pixel of an organic light emitting display panel of FIG. 1.

Referring to FIG. 2, each of the pixels PX includes an organic light emitting diode OLED and a circuit part controlling the organic light emitting diode OLED. The circuit part includes a first transistor TR1, a second transistor TR2, and a capacitor CAP. The circuit diagram of the pixel PX should not be limited to the circuit diagram shown in FIG. 2.

The first transistor TR1 includes a control electrode connected to the gate line GL, an input electrode connected to the data line DL, and an output electrode. The first transistor TR1 outputs a data signal applied to the data line DL in response to the gate signal applied to the gate line GL.

The capacitor CAP includes a first electrode connected to the first transistor TR1 and a second electrode applied with a first source voltage ELVDD. The capacitor CAP is charged with a voltage corresponding to the data signal provided from the first transistor TR1.

The second transistor TR2 includes a control electrode connected to the output electrode of the first transistor TR1 and the first electrode of the capacitor CAP, an input electrode applied with the first source voltage ELVDD, and an output electrode. The output electrode of the second transistor TR2 is connected to the organic light emitting diode OLED. The second transistor TR2 controls a driving current flowing through the organic light emitting diode OLED in response to the voltage charged in the capacitor CAP.

The organic light emitting diode OLED includes an anode (not shown) connected to the second transistor TR2 to receive the first source voltage ELVDD and a cathode (not shown) applied with a second source voltage ELVSS. In addition, the organic light emitting diode OLED includes a light emitting layer (not shown) disposed between the anode and the cathode. The organic light emitting diode OLED emits a light during a turn-on period of the second transistor TR2.

Figure 3:
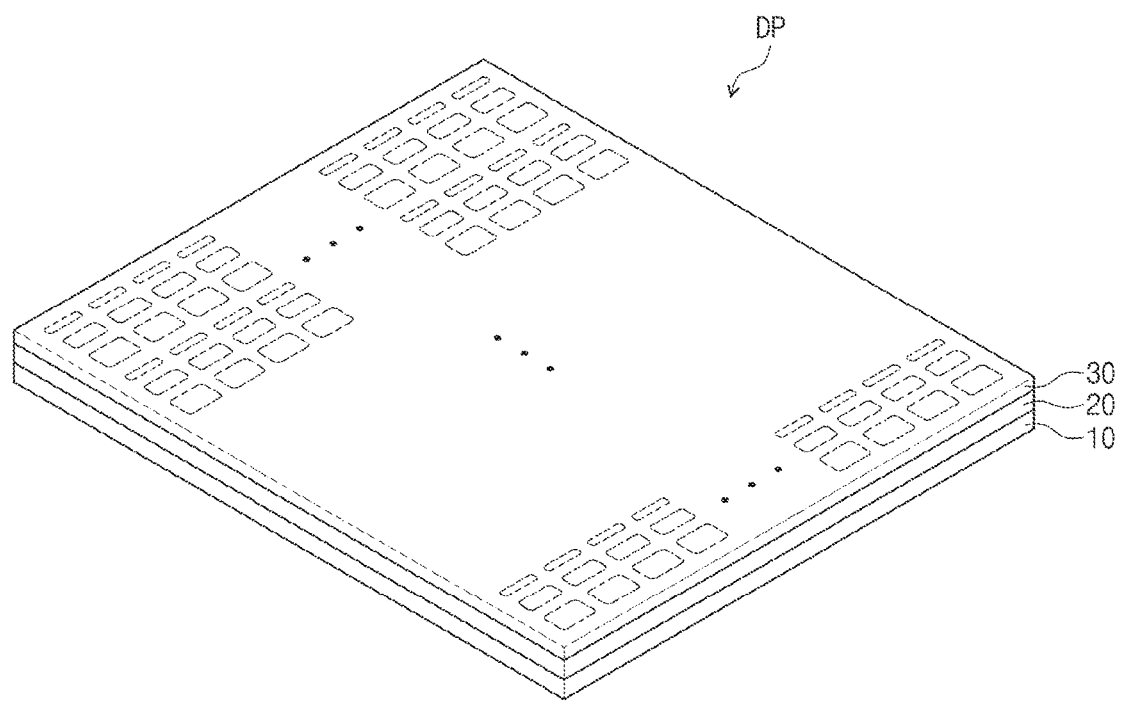
FIG. 3 is a perspective view of the organic light emitting display panel of FIG. 1.
Figure 4:
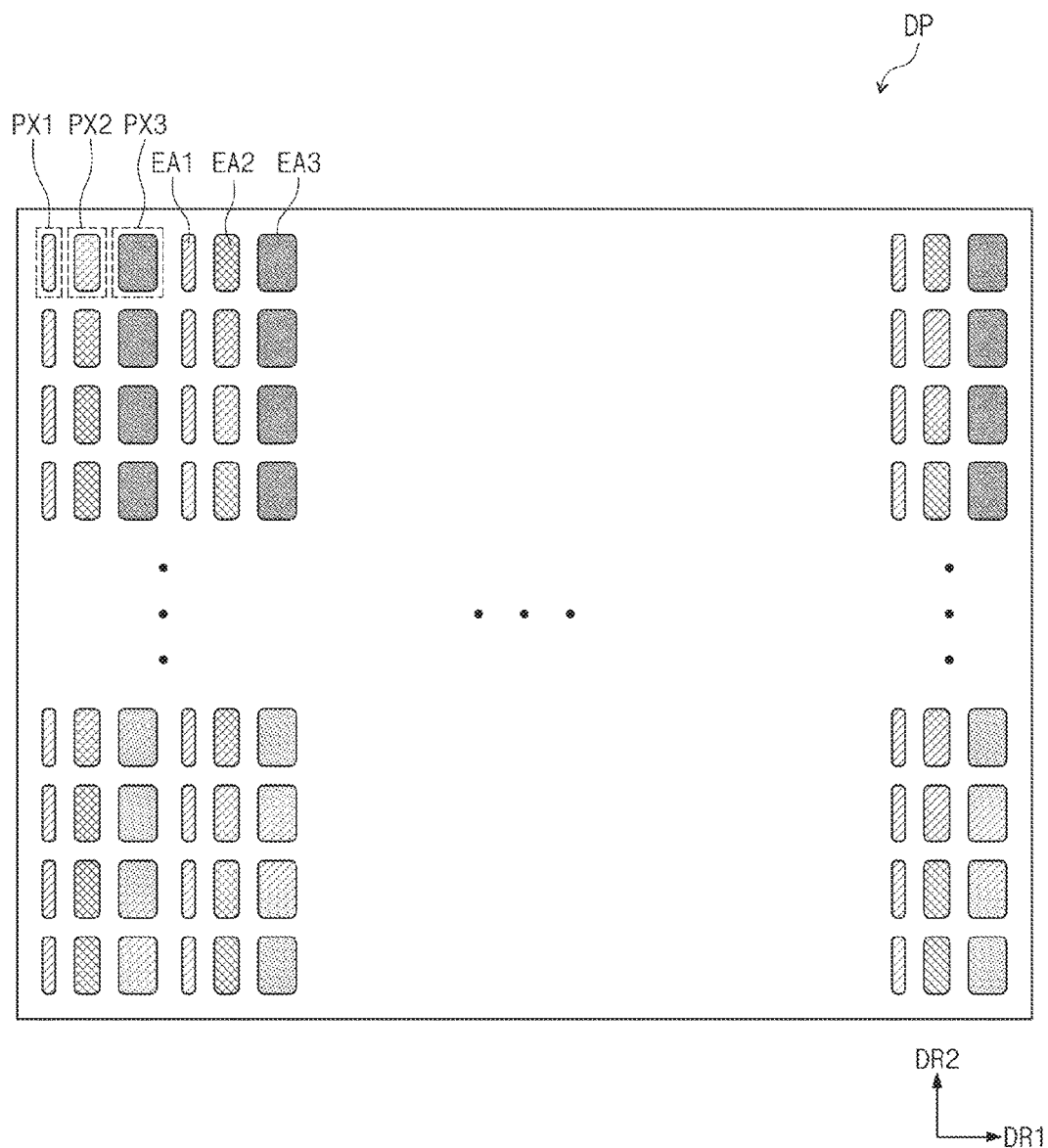
FIGS. 4 and 5 are plan views illustrating the organic light emitting display panel of FIG. 3.
Figure 5:
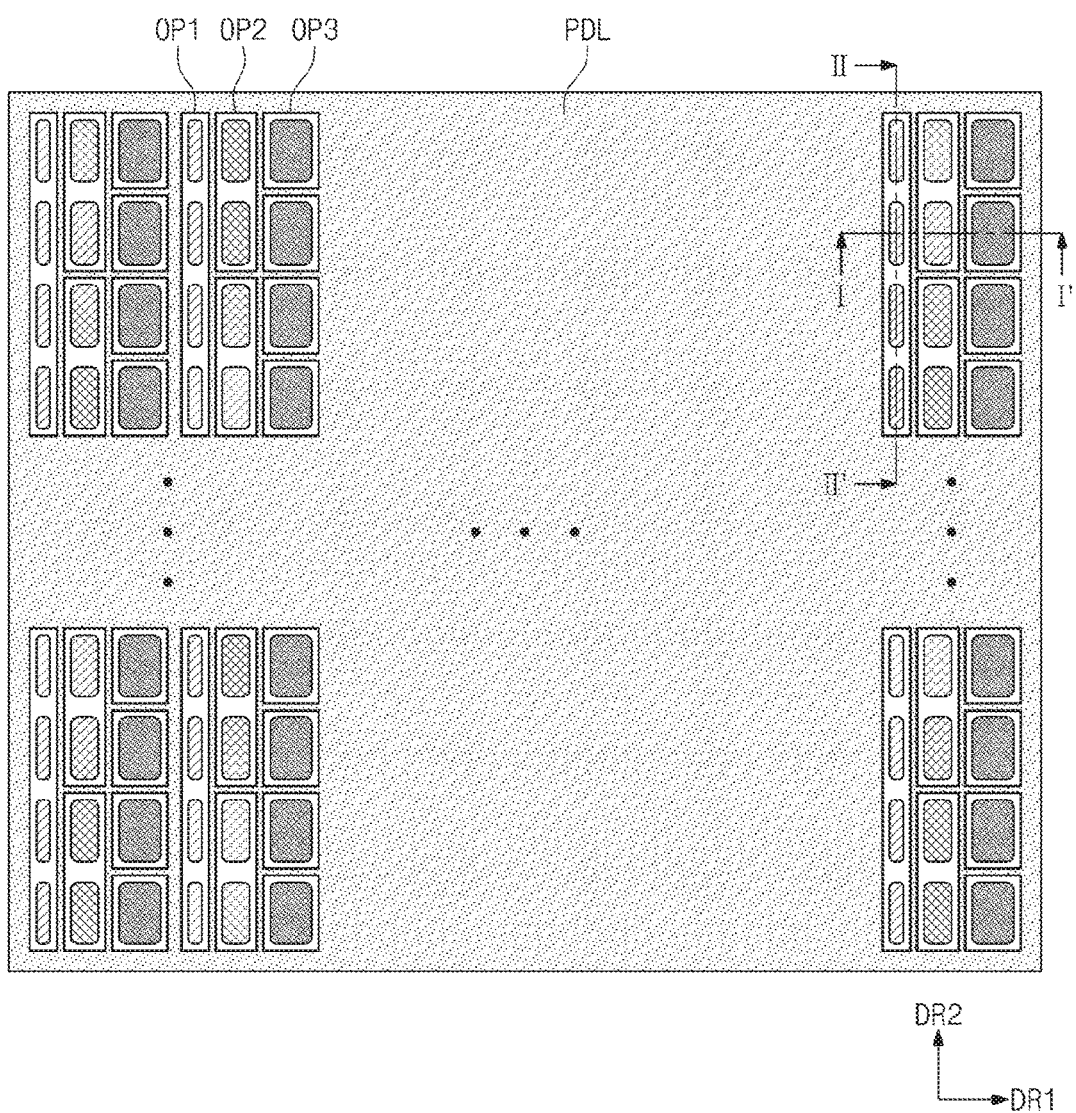
Figure 6:
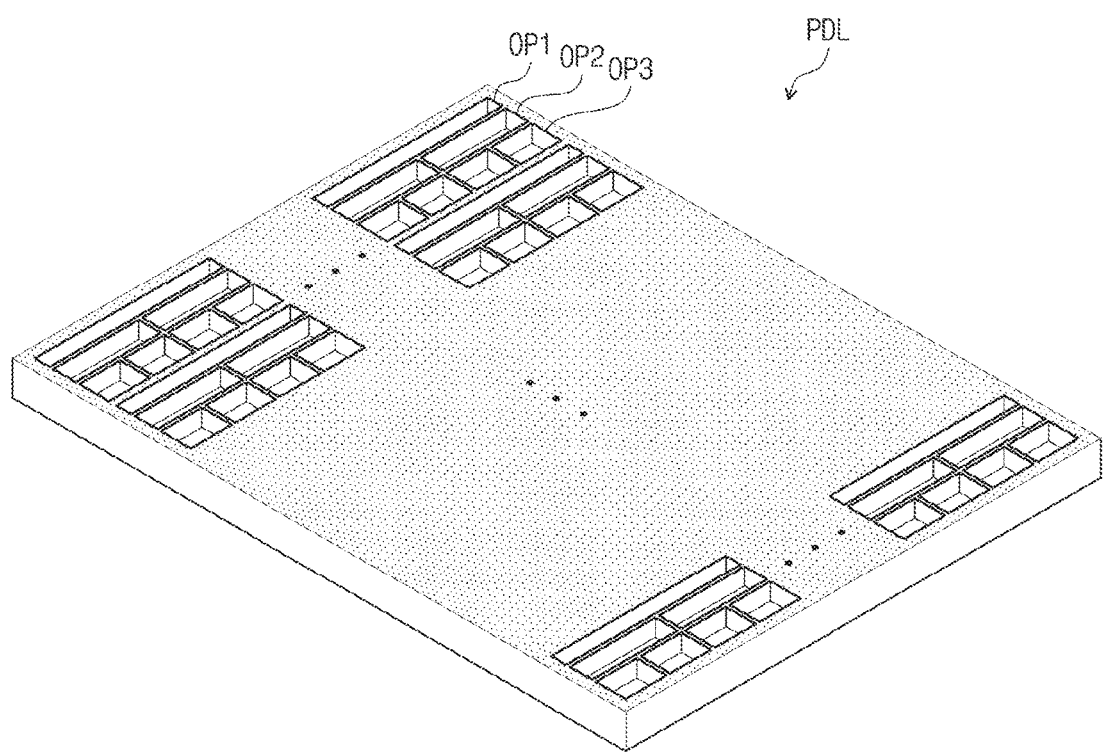
FIG. 6 is a perspective view of the organic light emitting display panel illustrating a pixel definition layer of FIG. 3.

FIG. 3 is a perspective view illustrating the organic light emitting display panel DP of the organic light emitting display device of FIG. 1. FIGS. 4 and 5 are plan views illustrating the organic light emitting display panel DP of FIG. 3. FIG. 6 is a perspective view illustrating a pixel definition layer shown in FIG. 3.

Referring to FIG. 3, an element layer 20 is formed or otherwise disposed on a base substrate 10.

The base substrate 10 includes an organic layer and/or an inorganic layers. In particular, the base substrate 10 may include an organic material to provide a flat surface.

The base substrate 10 includes a conductive layer (not shown) and an insulating layer (not shown). The conductive layer includes the first and second transistors TR1 and TR2 shown in FIG. 2. In addition, the conductive layer includes the gate lines GL1 to GLn and the data lines DL1 to DLn shown in FIGS. 1 and 2. The insulating layer is formed or otherwise disposed at an uppermost position of the base substrate 10.

The element layer 20 includes a pixel definition layer (not shown) and an organic light emitting diode (not shown).

An encapsulation layer 30 is formed or otherwise disposed on the element layer 20. The encapsulation layer 30 includes thin film encapsulation layers. The thin film encapsulation layers include a silicon nitride layer and a silicon oxide layer. Hereinafter, the present exemplary embodiment will be described except for the encapsulation layer 30.

FIG. 4 shows pixels PX1, PX2, and PX3 and light emitting areas EA1, EA2, and EA3 corresponding to the pixels PX1, PX2, and PX3. The organic light emitting diode is formed or otherwise disposed in each of the light emitting areas EA1, EA2, and EA3.

The light emitting area EA1 (hereinafter, "first light emitting area") of the first pixel PX1 has an area smaller than that of the light emitting area EA2 (hereinafter "second light emitting area") of the second pixel PX2. The area of the second light emitting area EA2 is smaller than that of the light emitting area EA3 (hereinafter, "third light emitting area") of the third pixel PX3. Although, the area of the first, second, and third light emitting areas EA1, EA2, and EA3 is described and illustrated as the first light emitting area EA1 is smaller than the second light emitting area EA2, and second light emitting area EA2 is smaller than the third light emitting area EA3 (i.e., EA1<EA2<EA3), the exemplary embodiments should not be limited to such size restrictions for the light emitting areas. Instead, the first, second, and third light emitting areas EA1, EA2, EA3 may have different relative sizes than what is illustrated and described (e.g., EA3<EA2<EA1 and EA1<EA3<EA2).

The first, second, and third light emitting areas EA1, EA2, and EA3 are alternately arranged in the first direction DR1. Accordingly, the first light emitting area EA1 may be disposed between the second and third light emitting areas EA2 and EA3 in the first direction DR1. In addition, the second light emitting area EA2 may be disposed between the first and third light emitting areas EA1 and EA3 and the third light emitting areas EA3 may be disposed between the first and second light emitting areas EA1 and EA2.

The first light emitting areas EA1 are arranged in one line along the second direction DR2 (i.e., arranged in a column). The second light emitting areas EA2 are arranged in one line along the second direction DR2 (i.e., arranged in a column). The third light emitting areas EA3 are arranged in one line along the second direction DR2 (i.e., arranged in a column).

The first light emitting area EA1 emits a light having a first wavelength, the second light emitting area EA2 emits a light having a second wavelength, and the third light emitting area EA3 emits a light having a third wavelength. The first wavelength is longer than the second wavelength and the second wavelength is longer than the third wavelength. The first wavelength is in a range from about 610 nm to about 750 nm. In this case, the light emitted from the first light emitting area EA1 is a red color. The second wavelength is in a range from about 495 nm to about 570 nm. In this case, the light emitted from the second light emitting area EA2 is a green color. The third wavelength is in a range from about 450 nm to about 495 nm. In this case, the light emitted from the third light emitting area EA3 is a blue color. However, the wavelengths of the light emitted from the first, second, and third light emitting areas EA1, EA2, and EA3 should not be limited to such wavelength or colors.

The organic light emitting display panel DP displays desired colors by combining the lights respectively emitted from the first, second, and third light emitting areas EA1, EA2, and EA3.

Referring to FIGS. 5 and 6, the pixel definition layer PDL expose the first, second, and third light emitting areas EA1, EA2, and EA3.

The pixel definition layer PDL includes of first openings OP1, second openings OP2, and third openings OP3, which are formed through the pixel definition layer PDL.

The first openings OP1 are defined to correspond to n (n is a natural number equal to or greater than 2) first light emitting areas EA1. Therefore, the n first light emitting areas EA1 emit the light having the first wavelength through the first openings OP1. In this case, the "n" may be, but not limited to, 4. In other words, a single first opening OP1 may include four first light emitting areas EA1 and four first pixels PX1.

The second openings OP2 are defined to correspond to m (m is a natural number equal to or greater than 1 and smaller than n) second light emitting areas EA2. Therefore, the m second light emitting areas EA2 emit the light having the second wavelength through the second openings OP2. In this case, the "m" may be, but not limited to, 2. In other words, a single second opening OP2 may include two second light emitting areas EA2 and two second pixels PX2.

The third openings OP3 are defined to correspond to k (k is a natural number equal to or greater than 1 and equal to or smaller than m) third light emitting areas EA3. Therefore, the k third light emitting areas EA3 emit the light having the third wavelength through the third openings OP3. In this case, the "k" may be, but not limited to, 1. In other words, a single third opening OP3 may include a single third light emitting areas EA3 and a single third pixel PX3.

Figure 7A:
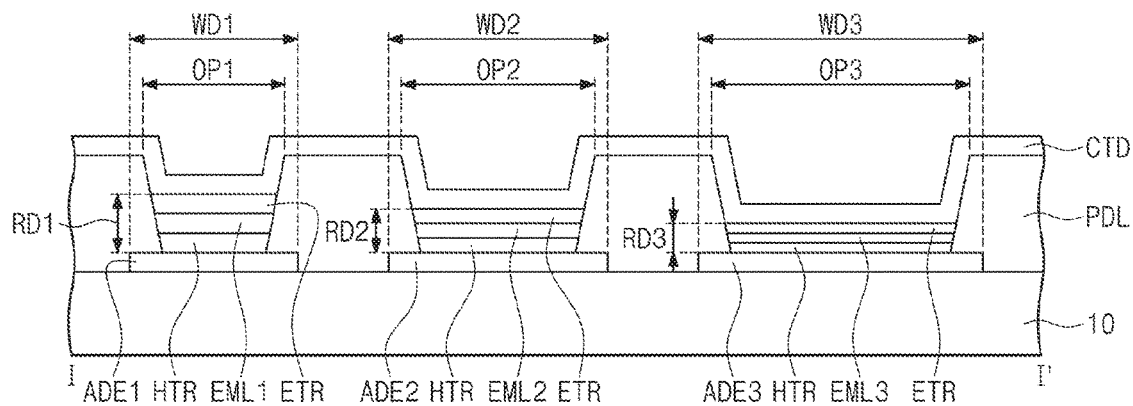
FIG. 7A is a cross-sectional view of the organic light emitting display panel taken along sectional line I-I' of FIG. 5.
Figure 7B:
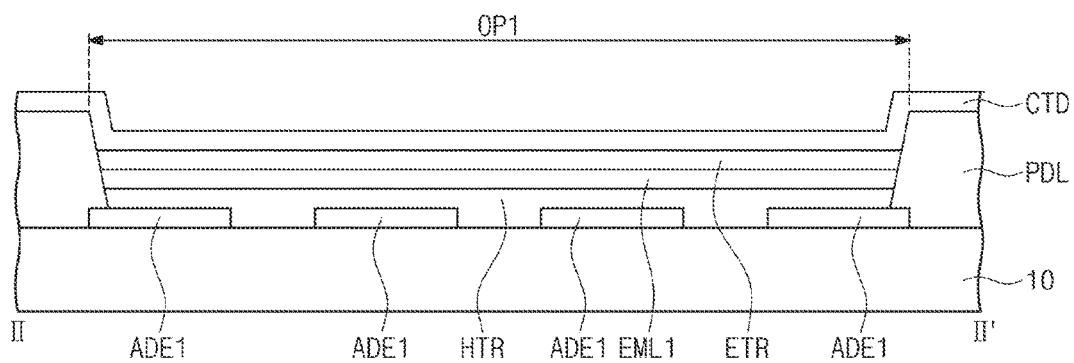
FIG. 7B is a cross-sectional view of the organic light emitting display panel taken along sectional line II-II' of FIG. 5.

FIG. 7A is a cross-sectional view taken along a line I-I' shown in FIG. 5. FIG. 7B is a cross-sectional view taken along a line II-II' shown in FIG. 5.

Referring to FIGS. 7A and 7B, first, second, and third anode electrodes ADE1, ADE2, and ADE3 are disposed on the base substrate 10. A width (hereinafter, "a first width") WD1 of the first anode ADE1 is smaller than a width (hereinafter, "a second width") WD2 of the second anode ADE2. The second width WD2 is smaller than a width (hereinafter, "a third width") WD3 of the third anode ADE3. Due to a difference between the first, second, and third widths WD1, WD2, and WD3, a difference exists between the areas of the first, second, and third light emitting areas EA1, EA2, and EA3 as previously illustrated in FIG. 4.

The pixel definition layer PDL exposes the first, second, and third anodes ADE1, ADE2, and ADE3 and is disposed on the base substrate 10. The pixel definition layer PDL is disposed to overlap with a portion of the first, second, and third anodes ADE1, ADE2, and ADE3, but exemplary embodiments should not be limited to having the pixel definition layer PDL disposed to overlap a portion of the first, second, and third anodes ADE1, ADE2, and ADE3. The pixel definition layer PDL may be disposed to not overlap with the first, second, and third anodes ADE1, ADE2, and ADE3.

The pixel definition layer PDL includes the first, second, and third openings OP1, OP2, and OP3, which are formed through the pixel definition layer PDL.

Hole transport regions HTR are disposed on the first, second, and third anodes ADE1, ADE2, and ADE3. The hole transport regions HTR inject and transport holes to first, second, and third light emitting layers EML1, EML2, and EML3 from the first, second, and third anodes ADE1, ADE2, and ADE3. The hole transport region HTR includes at least one of a hole injection layer, a hole transport layer, a buffer layer, and an electron blocking layer.

The hole transport region HTR has a single-layer structure of a single material, a single-layer structure of different materials from each other, or a multi-layer structure of different materials from each other. For instance, the hole transport region HTR has a single-layer structure of different materials from each other, or has a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron blocking layer, which are sequentially stacked from the first, second, and third anodes ADE1, ADE2, and ADE3. However, exemplary embodiments should not be limited to such structures.

Each of the first, second, and third light emitting layers EML1, EML2, and EML3 is disposed on a corresponding hole transport region of the hole transport regions HTR. When the first light emitting layer EML1 emits the light having the red color, the first light emitting layer EML1 includes a fluorescent material containing 2-(4-biphenylyl)-5-phenyl-1,3,4-oxadiazole:tris (dibenzoylmethane) phenanthoroline europium (III) (also known as PBD:Eu (dbm)3(phen)) or Perylene, or both. The first light emitting layer EML1 includes dopants selected from a metal complex, such as bis(1-phenyl-isoquinoline)(acetylacetonato) iridium(III) (also know as Ir(piq)$_2$(acac)), bis(2-phenylquinoline)(acetylacetonate)iridium(III) (also known as Ir(2-phq)$_2$(acac) or PQIr(acac)), tris(2-phenylquinoline)iridium (III) (also known as Ir(2-phq)$_3$), platinum octaethylporphyrin (also known as PtOEP), etc., and an organometallic complex.

When the second light emitting layer EML2 emits the light having the green color, the second light emitting layer EML2 includes a fluorescent material containing tris(8-hydroxyquinolino)-aluminum (also known as Alq$_3$). The second light emitting layer EML2 includes dopants selected from a metal complex, such as fac-tris(2-phenylpyridine) iridium(III) (also known as Ir(ppy)$_3$), and an organometallic complex.

When the third light emitting layer EML3 emits the light having the blue color, the third light emitting layer EML3 includes a fluorescent material including any one selected from the groups consisting of spiro-4,4'-bis(2,2'diphenyl-vinil)-1,1'-biphenyl (also known as spiro-DPVBi), 2,2',7,7'-tetrakis(biphenyl-4-yl)-9,9'-spirobifluorene (also known as spiro-6P), distyryl-benzene (also known as DSB), distyryl-arylene (also known as DSA), polyfluorene-based polymer and poly(p-phenylene vinylene)-based polymer. The third light emitting layer EML3 includes dopants selected from a metal complex, such as Iridium (III) bis(2-(4,6-difluorophenyl pyridinato-N,C2 picolinate) (also known as Ir(4,6-F$_2$ppy)$_2$(pic)), and an organometallic complex.

Electron transport regions ETR are disposed on the first, second, and third light emitting layers EML1, EML2, and EML3.

The electron transport region ETR includes at least one of a hole blocking layer, an electron transport layer, and an electron injection layer, but it should not be limited to such layers.

For instance, the electron transport region ETR has a structure of the electron transport layer/the electron injection layer or the hole block layer/the electron transport layer/the electron injection layer, which are sequentially stacked from the light emitting layer, or a single-layer structure obtained by mixing two or more layers, but it should not be limited such a structure.

The cathode CTD is disposed on the electron transport region ETR and the pixel definition layer PDL.

The cathode CTD may be a common electrode or a negative electrode. The cathode CTD may be a transmissive, transflective, or reflective electrode. When the cathode CTD is the transmissive electrode, the cathode CTD includes Li, Ca, LiF/Ca, LiF/Al, Al, Mg, BaF, Ba, Ag, a compound thereof, or a mixture of Ag and Mg.

The first light emitting area EA1 (refer to FIG. 4) is defined by an area in which the first anode ADE1 is overlapped with the first light emitting layer EML1. The second light emitting area EA2 (refer to FIG. 4) is defined by an area in which the second anode ADE2 is overlapped with the second light emitting layer EML2. The third light emitting area EA3 (refer to FIG. 4) is defined by an area in which the third anode ADE3 is overlapped with the third light emitting layer EML3. However, the first, second, and third light emitting areas EA1, EA2, and EA3 should not be limited to such an area that is defined by the overlapping of the anodes ADE1, ADE2, and ADE3 by the light emitting layers EML1, EML2, and EML3. Instead, the first, second, and third light emitting areas EA1, EA2, and EA3 may be defined to correspond solely to the first, second, and third light emitting layers EML1, EML2, and EML3.

The lights respectively emitted from the first, second, and third light emitting layers EML1, EML2, and EML3 have different wavelengths from each other. Accordingly, the organic light emitting diodes have different thicknesses to satisfy the resonance structure.

A first resonance distance RD1 is obtained by measuring a distance between the first anode ADE1 and the cathode CTD in a thickness direction of the first light emitting layer EML1. A second resonance distance RD2 is obtained by measuring a distance between the second anode ADE2 and the cathode CTD in a thickness direction of the second light emitting layer EML2. A third resonance distance RD3 is obtained by measuring a distance between the third anode ADE3 and the cathode CTD in a thickness direction of the third light emitting layer EML3.

The first resonance distance RD1 is longer than the second resonance distance RD2. This is because the first wavelength of the light emitted from the first light emitting layer EML1 is longer than the second wavelength of the light emitted from the second light emitting layer EML2.

The second resonance distance RD2 is longer than the third resonance distance RD3. This is because the second wavelength of the light emitted from the second light emitting layer EML2 is longer than the third wavelength of the light emitted from the third light emitting layer EML3.

To form the organic light emitting diode having the resonance structure, an inkjet printing method is widely used. When the inkjet printing method is used, an amount and a concentration of a liquefied material used to form the hole transport region HTR, the first, second, and third light emitting layers EML1, EML2, and EML3, and the electron transport region ETR may be controlled. In this case, the first, second, and third resonance distances RD1, RD2, and RD3 may be easily controlled.

As shown in FIG. 4, the first light emitting area EA1 is small when compared to the second light emitting area EA2 and the third light emitting area EA3. The relatively small size of the first light emitting area EA1 makes it difficult to control the first resonance distance RD1 to the desired resonance distance when injecting liquefied material for hole transport region HTR, the first light emitting layer EML1, and the electron transport region ETR. Accordingly, as shown in FIGS. 5 and 6, the first opening OP1 includes n first light emitting areas EA1 (i.e., four first light emitting areas EA1), providing a larger area (i.e., wider in the first direction) for injecting the liquefied material through the pixel definition layer PDL. The larger area makes it easier to control the first resonance distance RD1 when compared to injecting liquefied material in a single first light emitting area EA1.

The area of the second light emitting area EA2 is larger than the area of the first light emitting area EA1, but smaller than the area of the third light emitting area EA3. Therefore, it is easier to control the second resonance distance RD2 when injecting the liquefied material for the hole transport region HTR, the second light emitting layer EML2, and the electron transport region ETR than the first resonance distance RD1 for an individual first light emitting area EA1 but not as easy to control the third resonance distance RD3 for an individual third light emitting area EA3. Accordingly, when the liquefied material is injected through the second opening OP2 of the pixel definition layer PDL, each second opening OP2 corresponds to m second light emitting areas EA2 (i.e., two second light emitting areas EA2). Thus, the liquefied material is injected to a larger area (i.e., wider area in the second direction DR2) than a single second light emitting area EA2 making it easier to control the second resonance distance RD2 when compared to injecting the liquefied material in a single second light emitting area EA2.

The area of the third light emitting area EA3 is larger than the area of the first light emitting area EA1 and the area of the second light emitting area EA2. Thus, it is easier to control the third resonance distance RD3 when injecting the liquefied material for the hole transport region HTR, the third light emitting layer EML3, and the electron transport region ETR than the second resonance distance RD2 for an individual second light emitting area EA2. The liquefied material is injected through the third opening OP3 of the pixel definition layer PDL corresponding to k third light emitting areas EA3 (i.e., each third opening OP3 may include one third light emitting areas EA3).

Referring to FIG. 7B, the hole transport region HTR is disposed on the base substrate 10 to cover the first anodes ADE1. The first light emitting layer EML1 is disposed on the hole transport region HTR. The electron transport region ETR is disposed on the first light emitting layer EML1. The cathode CTD is disposed on the electron transport region ETR and the pixel definition layer PDL.

The pixel definition layer PDL exposes n first anodes ADE1. The first opening OP1 is defined by an area corresponding to n first anodes ADE1.

Areas of the first light emitting layer EML1, which are overlapped with the first anodes ADE1, emit the light having the first wavelength.

FIGS. 7C to 7G illustrate a manufacturing method of the organic light emitting display panel as sectional views taken along sectional line I-I' of FIG. 5. FIG. 8 is a flowchart illustrating a manufacturing method of the organic light emitting display panel of FIG. 5 and corresponds to FIGS. 7C-7G.

Figure 7C:
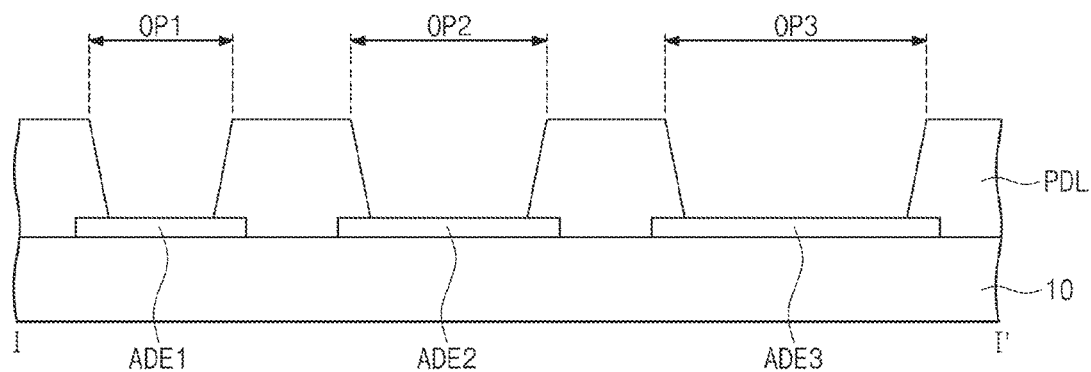
FIGS. 7C, 7D, 7E, 7F, and 7G illustrate a manufacturing method of the organic light emitting display panel as sectional views taken along sectional line I-I' of FIG. 5.
Figure 8:
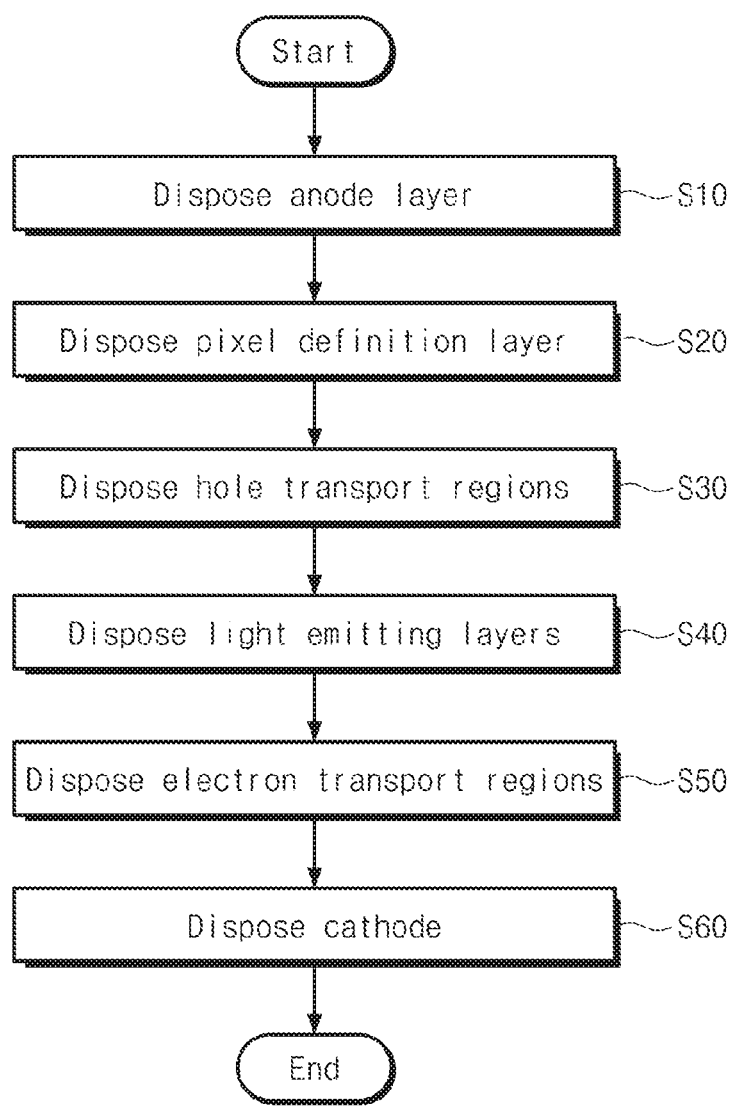
FIG. 8 is a flowchart illustrating a manufacturing method of the organic light emitting display panel of FIG. 5 and corresponding to FIGS. 7C-7G.

Referring to FIGS. 7C and 8, an anode layer including the first, second, and third anodes ADE1, ADE2, and ADE3 is formed or otherwise disposed on the base substrate 10 (S10). In this case, the area of the first anode ADE1 is smaller than the area of the second anode ADE2 and the area of the second anode ADE2 is smaller than the area of the third anode ADE3.

The pixel definition layer PDL is formed or otherwise disposed on the base substrate 10 (S20). The first, second, and third openings OP1, OP2, and OP3 are defined through the pixel definition layer PDL. The first opening OP1 exposes the n (n is a natural number equal to or greater than 2) first anodes ADE1 at once. The second opening OP2 exposes the m (m is a natural number equal to or greater than 1) second anodes ADE2 at once. The third opening OP3 exposes the k (k is a natural number equal to or greater than 1) third anodes ADE3 at once.

Figure 7D:
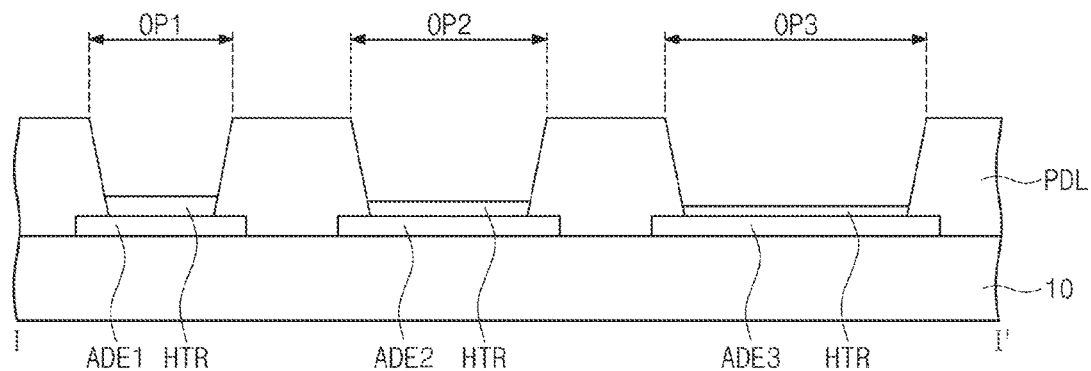

Referring to FIGS. 7D and 8, the liquefied material is disposed to the areas corresponding to the first, second, and third openings OP1, OP2, and OP3 to form the hole transport regions HTR on the first, second, and third anodes ADE1, ADE2, and ADE3 (S30). In this case, the amount and the concentration of the liquefied material disposed to the areas corresponding to the first, second, and third openings OP1, OP2, and OP3 are constant. However, the thicknesses of the hole transport regions HTR may be different from each other. The resonance distance of the organic light emitting diode may be controlled using the difference in thickness of the hole transport region HTR.

The hole transport region HTR is formed or otherwise disposed by the inkjet printing method, but it should not be limited to such a method. For example, the hole transport region HTR may be formed by a vacuum deposition method, a spin coating method, a cast method, a Langmuir-Blodgett (LB) method, a laser printing method, or a laser induced thermal imaging (LITI) method.

Figure 7E:
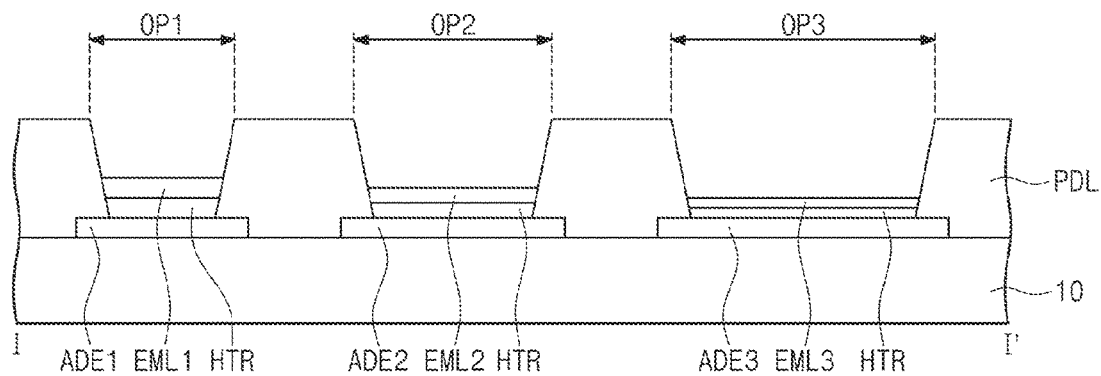

Referring to FIGS. 7E and 8, the liquefied material is disposed to the areas corresponding to the first, second, and third openings OP1, OP2, and OP3 to form the first, second, and third light emitting layers EML1, EML2, and EML3 on the hole transport region HTR (S40). In detail, a first organic material is disposed to the area corresponding to the first opening OP1 to form the first light emitting layer EML1, a second organic material is disposed to the area corresponding to the second opening OP2 to form the second light emitting layer EML2, and a third organic material is disposed to the area corresponding to the third opening OP3 to form the third light emitting layer EML3.

In this case, the first, second, and third organic materials are different from each other. This is because the wavelengths of the lights emitted from the first, second, and third light emitting layers EML1, EML2, and EML3 are different from each other.

The first light emitting layer EML1 emits the light having the first wavelength, the second light emitting layer EML2 emits the light having the second wavelength, and the third light emitting layer EML3 emits the light having the third wavelength. The first, second, and third wavelengths are as described with reference to FIG. 4. The liquefied organic materials disposed to form the first, second, and third light emitting layers EML1, EML2, and EML3 are as described with reference to FIG. 7A.

The thicknesses of the first, second, and third light emitting layers EML1, EML2, and EML3 may be different from each other. As described above, the resonance distance of the organic light emitting diode may be controlled by controlling the thickness of each of the first, second, and third light emitting layers EML1, EML2, and EML3.

The first, second, and third light emitting layers EML1, EML2, and EML3 are formed by the inkjet printing method, but it should not be limited thereto or thereby. As another way, the first, second, and third light emitting layers EML1, EML2, and EML3 may be formed by a vacuum deposition method, a spin coating method, a cast method, a Langmuir- Blodgett (LB) method, a laser printing method, or a laser induced thermal imaging (LITI) method.

Figure 7F:
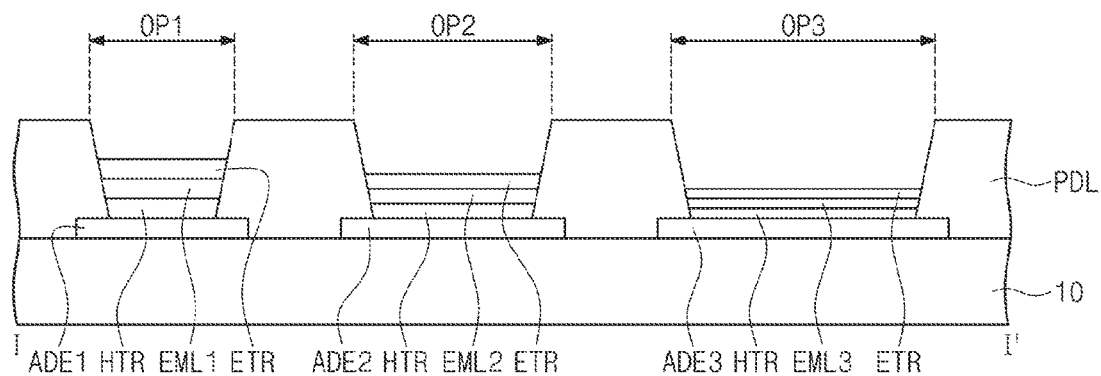

Referring to FIGS. 7F and 8, the electron transport regions ETR are formed or otherwise disposed on the first, second, and third light emitting layers EML1, EML2, and EML3 (S50). The electron transport regions ETR may be disposed by disposing the liquefied material to the areas corresponding to the first, second, and third openings OP1, OP2, and OP3.

The thicknesses of the electron transport regions ETR may be different from each other. The resonance distance of the organic light emitting diode may be controlled by controlling the thickness of each of the electron transport regions ETR.

The electron transport region ETR is disposed by the inkjet printing method, but it should not be limited to such a method. For example, the electron transport region ETR may be formed by a vacuum deposition method, a spin coating method, a cast method, a Langmuir-Blodgett (LB) method, a laser printing method, or a laser induced thermal imaging (LITI) method.

Figure 7G:
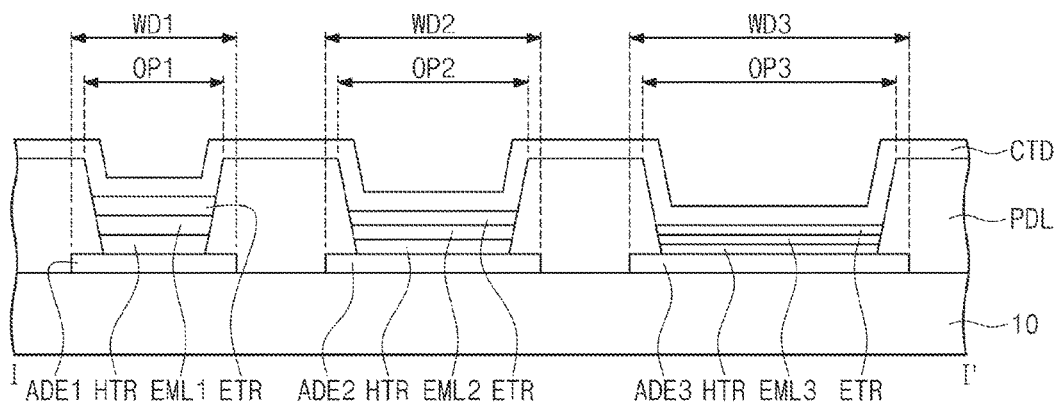

Referring to FIGS. 7G and 8, the cathode CTD is formed or otherwise disposed on the hole transport regions ETR and the pixel definition layer PDL (S60). The material of the cathode CTD is as described with reference to FIG. 7A.

Figure 9:
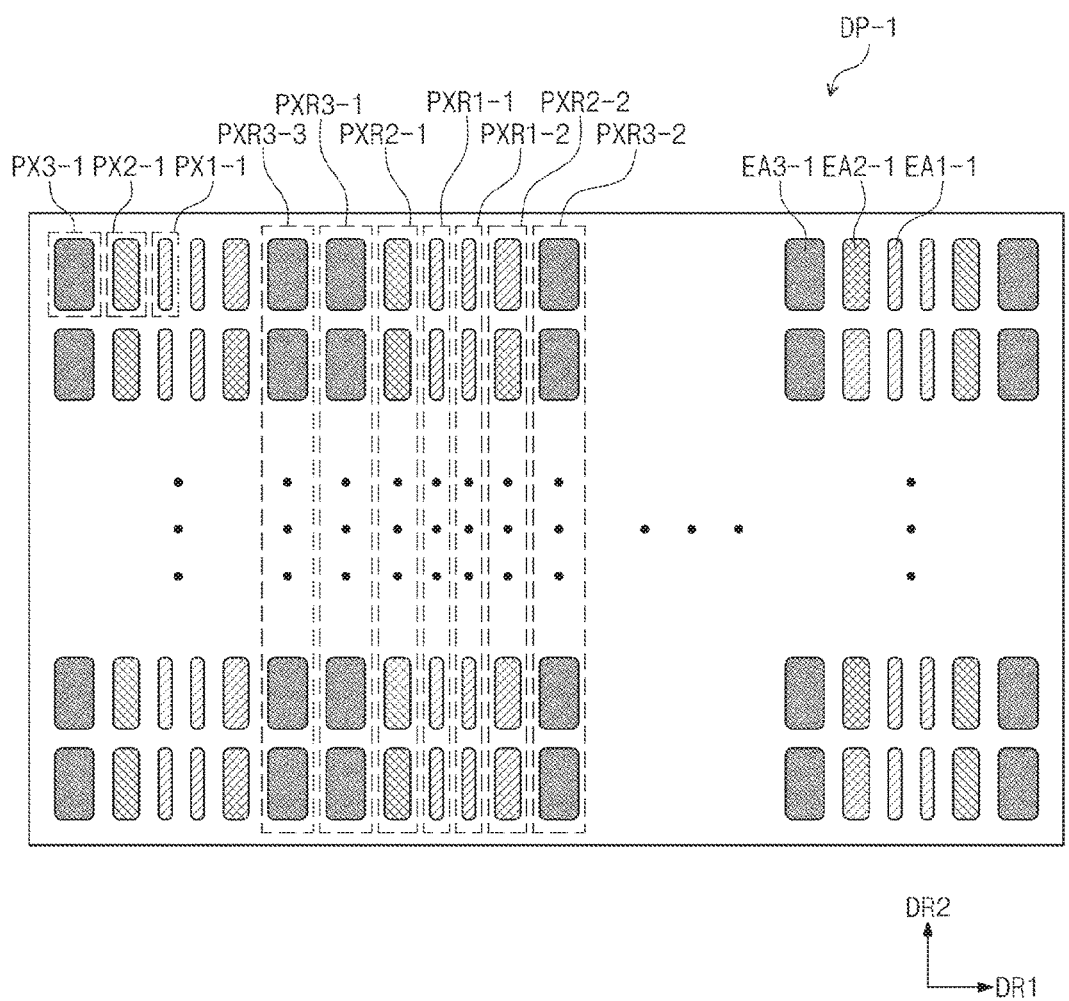
FIGS. 9 and 10 are plan views showing an organic light emitting display panel according to an exemplary embodiment.
Figure 10:
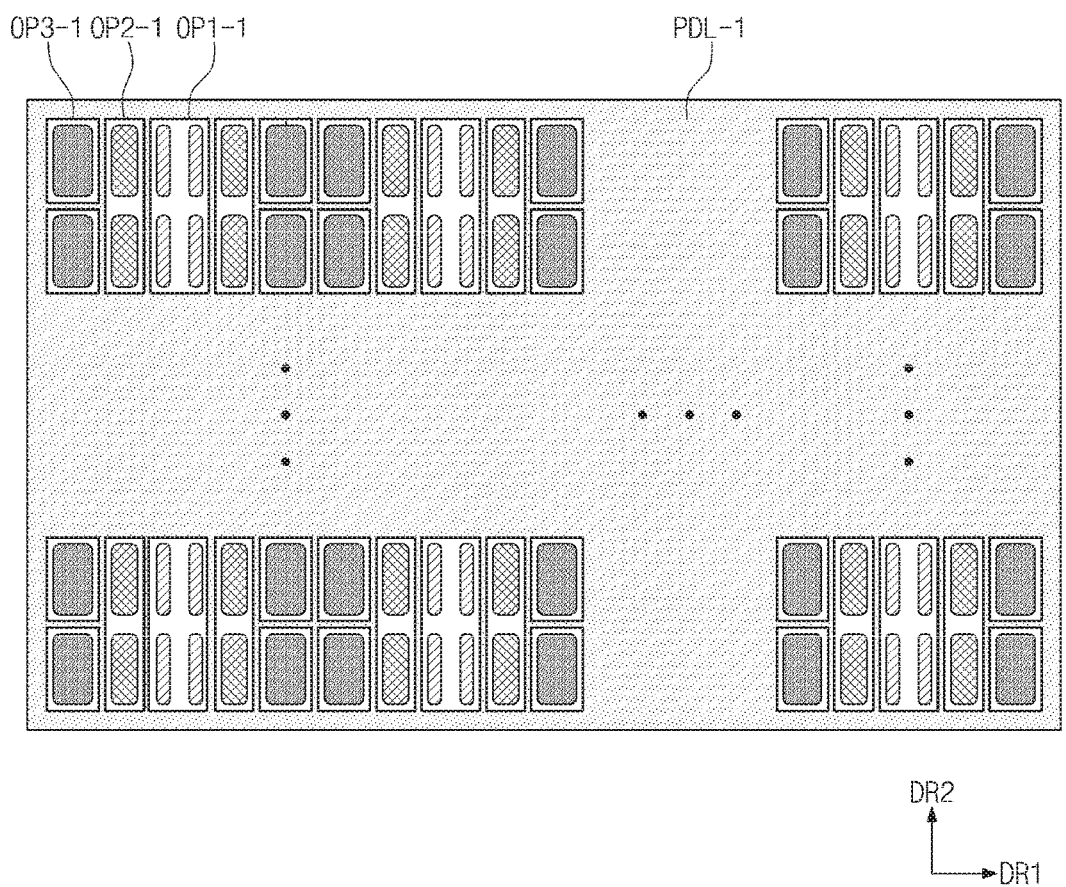

FIGS. 9 and 10 are plan views showing an organic light emitting display panel according to an exemplary embodiment.

Referring to FIG. 9, an organic light emitting display panel DP-1 includes pixels PX1-1, PX2-1, and PX3-1 and light emitting areas EA1-1, EA2-1, and EA3-1 respectively corresponding to the pixels PX1-1, PX2-1, and PX3-1.

The first pixels PX1-1 arranged in the second direction DR2 form first pixel columns PXR1-1 and PXR1-2. The second pixels PX2-1 arranged in the second direction DR2 form second pixel columns PXR2-1 and PXR2-2. The third pixels PX3-1 arranged in the second direction DR2 form third pixel columns PXR3-1 and PXR3-2. The pixel columns PXR1-1, PXR1-2, PXR2-1, PXR2-2, PXR3-1, and PXR3-2 are arranged in order of the third pixel column PXR3-1, the second pixel column PXR2-1, the first pixel column PXR1-1, the first pixel column PXR1-2, the second pixel column PXR2-2, and the third pixel column PXR3-2 along the first direction DR1.

In other words, the first pixel column PXR1-1 is disposed between the other first pixel column PXR1-2 and the second pixel column PXR2-1, which are disposed adjacent to each other. The second pixel column PXR2-1 is disposed between the first pixel column PXR1-1 and the third pixel column PXR3-1. The third pixel column PXR3-1 is disposed between the other third pixel column PXR3-3 and the second pixel column PXR2-1, which are disposed adjacent to each other.

Referring to FIG. 10, a pixel definition layer PDL-1 includes a first opening OP1-1, a second opening OP2-1, and a third opening OP3-1, which are formed through the pixel definition layer PDL-1.

The first opening OP1-1 is defined to correspond to n (n is a natural number equal to or greater than 2) first light emitting areas EA1-1. Accordingly, the n first light emitting areas EA1-1 emit the light having the first wavelength through the first opening OP1-1. The n first light emitting areas EA1-1 are arranged in two columns. In this case, when n is 4, four first light emitting areas EA1-1 are arranged in two rows by two columns.

The second opening OP2-1 is defined to correspond to m (m is a natural number equal to or greater than 1 and smaller than n) second light emitting areas EA2-1. Therefore, the m second light emitting areas EA2-1 emit the light having the second wavelength through the second opening OP2-1. The m second light emitting areas EA2-1 are arranged in one column. In this case, when the m is 2, two second light emitting areas EA2-1 are arranged in two rows by one column.

The third opening OP3-1 is defined to correspond to k (k is a natural number equal to or greater than 1 and equal to or smaller than m) third light emitting areas EA3-1. Thus, the k third light emitting areas EA3-1 emit the light having the third wavelength through the third opening OP3-1. In this case, the k may be, but not limited to, 1.

Figure 11:
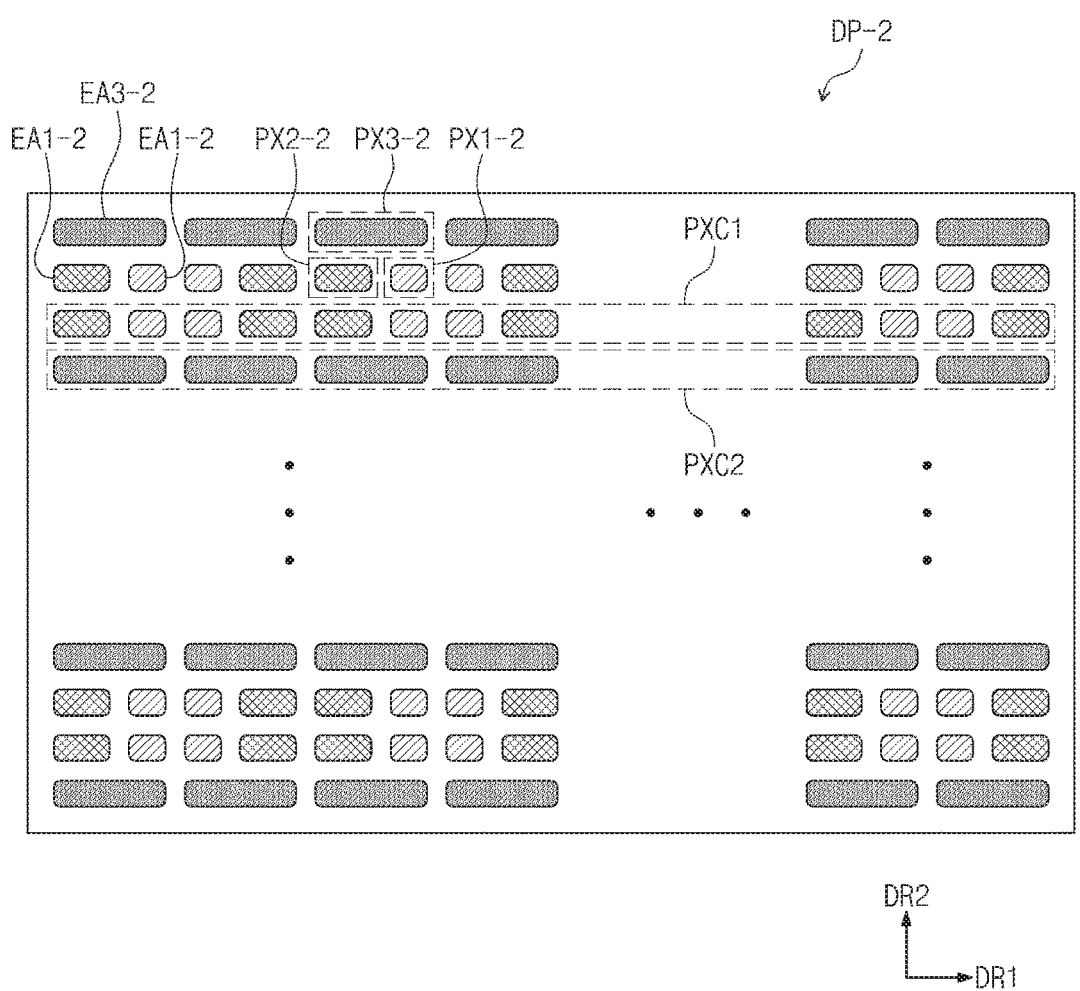
FIGS. 11 and 12 are plan views showing an organic light emitting display panel according to an exemplary embodiment.
Figure 12:
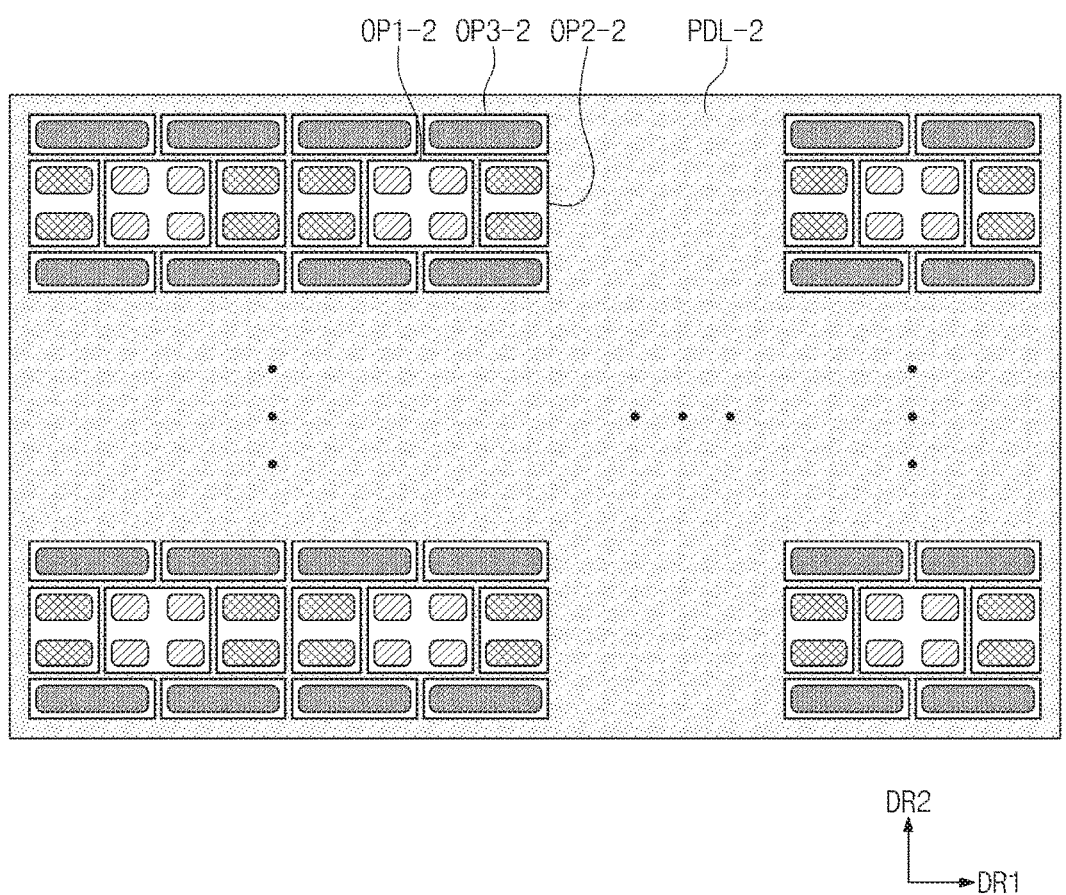

FIGS. 11 and 12 are plan views showing an organic light emitting display panel according to an exemplary embodiment.

Referring to FIG. 11, an organic light emitting display panel DP-2 includes pixels PX1-2, PX2-2, and PX3-2 and light emitting areas EA1-2, EA2-2, and EA3-2 respectively corresponding to the pixels PX1-2, PX2-2, and PX3-2.

A first pixel row PXC1 includes first pixels PX1-2 and second pixels PX2-2. Two first pixels PX1-2 are alternately arranged with two second pixels PX2-2 in the first pixel row PXC1 along the first direction DR1. However, only one first pixel PX1-2 or one second pixel PX2-2 is disposed at a start position and an end position of the first pixel row PXC1. For example, the first pixel row PXC1 may include the following arrangement in the first direction DR1: second pixel PX2-2, first pixel PX1-2, first pixel PX1-2, second pixel PX2-2, second pixel PX2-2, first pixel PX1-2, first pixel PX1-2, and second pixel PX2-2.

The second pixel row PXC2 includes third pixels PX3-2. The third pixels PX3-2 are arranged in one line along the first direction DR1.

Referring to FIG. 12, a pixel definition layer PDL-2 includes a first opening OP1-2, a second opening OP2-2, and a third opening OP3-2, which are formed through the pixel definition layer PDL-2.

The first opening OP1-2 is defined to correspond to four first light emitting areas EA1-2. Accordingly, the four first light emitting areas EA1-2 emit the light having the first wavelength through the first opening OP1-2. The four first light emitting areas EA1-2 are arranged in two rows by two columns.

The second opening OP2-2 is defined to correspond to two second light emitting areas EA2-2. Therefore, the two second light emitting areas EA2-2 emit the light having the second wavelength through the second opening OP2-2. The two second light emitting areas EA2-2 are arranged in two rows by one column.

The third opening OP3-2 is defined to correspond to one third light emitting area EA3-2. Thus, the one third light emitting areas EA3-2 emit the light having the third wavelength through the third opening OP3-2. The four first light emitting areas EA1-2 are arranged in two rows by two columns.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display panel, comprising:
   a base substrate comprising a plurality of pixels configured to emit a light; and a pixel definition layer disposed on the base substrate, the pixel definition layer comprising a plurality of openings,
wherein at least one first opening, among the plurality of openings, corresponds to light emitting areas of n (n is a natural number equal to or greater than 2) pixels among the plurality of pixels.

2. The organic light emitting display panel of claim 1, wherein wavelengths of light emitted by the n pixels are all the same.

3. The organic light emitting display panel of claim 2, wherein at least one second opening, among the plurality of openings, corresponds to light emitting areas of m (m is a natural number equal to or greater than 1 and smaller than n) pixels among the plurality of pixels.

4. The organic light emitting display panel of claim 3, wherein wavelengths of light emitted by the m pixels are all the same.

5. The organic light emitting display panel of claim 4, wherein an area of the light emitting area of each of the n pixels is smaller than an area of the light emitting area of each of the m pixels.

6. The organic light emitting display panel of claim 5, wherein the wavelengths of light emitted by the n pixels are longer than the wavelengths of light emitted by the m pixels.

7. The organic light emitting display panel of claim 6, wherein the light emitting area of each of the n pixels is defined by an area in which a first anode disposed on the base substrate is overlapped with a first light emitting layer disposed on the first anode, and the light emitting area of each of the m pixels is defined by an area in which a second anode disposed on the base substrate is overlapped with a second light emitting layer disposed on the second anode.

8. The organic light emitting display panel of claim 7, wherein the at least one first opening corresponding to light emitting areas of the n pixels is configured to expose the n first anodes and areas defined between the n first anodes of the base substrate, and the at least one second opening corresponding to light emitting area of the m pixels is configured to expose the m second anodes and areas defined between the m second anodes of the base substrate.

9. The organic light emitting display panel of claim 7, wherein the first light emitting layer and the second light emitting layer are formed by an inkjet printing method or a solution process.

10. The organic light emitting display panel of claim 4, wherein the n is 4 and the m is 2.

11. The organic light emitting display panel of claim 4, wherein the n pixels are arranged in a first line, the m pixels are arranged in a second line, and an arrangement direction in which the n pixels are arranged is equal to the arrangement direction in which the m pixels area are arranged.

* * * * *